(12) United States Patent
Ogawa

(10) Patent No.: US 11,855,612 B2
(45) Date of Patent: Dec. 26, 2023

(54) HIGH-SIDE DRIVER

(71) Applicant: TAMURA CORPORATION, Tokyo (JP)

(72) Inventor: Hiroo Ogawa, Saitama (JP)

(73) Assignee: TAMURA CORPORATION, Tokyo (JP)

(*) Notice: Subject to any disclaimer, the term of this patent is extended or adjusted under 35 U.S.C. 154(b) by 34 days.

(21) Appl. No.: 17/636,899

(22) PCT Filed: Sep. 17, 2020

(86) PCT No.: PCT/JP2020/035313
§ 371 (c)(1),
(2) Date: Feb. 21, 2022

(87) PCT Pub. No.: WO2021/060152
PCT Pub. Date: Apr. 1, 2021

(65) Prior Publication Data
US 2022/0278676 A1    Sep. 1, 2022

(30) Foreign Application Priority Data

Sep. 27, 2019 (JP) ................... 2019-177768

(51) Int. Cl.
H03K 3/00       (2006.01)
H03K 17/06      (2006.01)
H03K 17/567     (2006.01)

(52) U.S. Cl.
CPC ......... *H03K 17/063* (2013.01); *H03K 17/567* (2013.01); *H03K 2217/0063* (2013.01); *H03K 2217/0081* (2013.01)

(58) Field of Classification Search
None
See application file for complete search history.

(56) References Cited

U.S. PATENT DOCUMENTS 9,000,745 B2 * 4/2015 Shi .................. H02M 1/08
                                          323/282
9,973,082 B1   5/2018 Nakagawa
                       (Continued)

FOREIGN PATENT DOCUMENTS

EP    2658127       10/2013
JP    2000286687    10/2000
              (Continued)

OTHER PUBLICATIONS

"International Search Report (Form PCT/ISA/210) of PCT/JP2020/035313," dated Dec. 8, 2020, with English translation thereof, pp. 1-4.

(Continued)

*Primary Examiner* — Kenneth B Wells
(74) *Attorney, Agent, or Firm* — JCIPRNET

(57) ABSTRACT

A high-side driver circuit is a circuit that drives a power semiconductor switch. The high-side driver circuit comprises a main switch N-channel MOSFET that has a drain terminal that is connected to a plus-side Vdc of a power supply and has a source terminal that is connected to an OUT terminal for a signal that drives the power semiconductor switch, a charge storage circuit that stores charge from the Vdc, and a voltage detection-capable switch that detects the voltage difference between an output terminal of the charge storage circuit and the Vdc and, upon detecting that the output terminal voltage of the charge storage circuit is at least a specific voltage higher than the voltage of a plus-side Vcc of the power supply, applies part or all of the output voltage of the charge storage circuit to a gate terminal of the main switch N-channel MOSFET.

4 Claims, 10 Drawing Sheets

(56) References Cited

U.S. PATENT DOCUMENTS

2011/0298438 A1   12/2011  Shi
2013/0241601 A1    9/2013  Chen et al.

FOREIGN PATENT DOCUMENTS

| | | |
|---|---|---|
| JP | 2006270382 | 10/2006 |
| JP | 2010051105 | 3/2010 |
| JP | 2013230081 | 11/2013 |
| JP | 2017120968 | 7/2017 |
| JP | 6303060 | 3/2018 |
| WO | 2014041389 | 3/2014 |

OTHER PUBLICATIONS

"Search Report of Europe Counterpart Application", dated Oct. 20, 2022, pp. 1-8.

\* cited by examiner

HIGH-SIDE DRIVER

CROSS-REFERENCE TO RELATED APPLICATION

This application is a 371 application of the International PCT application serial no. PCT/JP2020/035313, filed on Sep. 17, 2020, which claims the priority benefits of Japan Patent Application No. 2019-177768, filed on Sep. 27, 2019. The entirety of each of the above-mentioned patent applications is hereby incorporated by reference herein and made a part of this specification.

TECHNICAL FIELD

The present invention relates to a gate drive circuit for driving a power semiconductor switch such as an IGBT.

RELATED ART

Power equipment such as high-power inverters and DCDC converters often uses high-frequency high-power switching elements. IGBTs (Insulated Gate Bipolar Transistors) or MOSFETs (Metal Oxide Semiconductor Field Effect Transistors) are often used as the high-frequency high-power switching elements. The input characteristic of a drive terminal (for example, gate terminal) of such an element is often capacitive, and a large current has to flow through during driving.
Therefore, various circuits for driving these high-frequency high-power switching elements have been proposed. Such circuits are often referred to as gate drive circuits. The present invention relates to an improved high-side driver used in the gate drive circuit.
Conventional Technology and Its Problem Examples of the conventional gate drive circuits for driving the high-frequency high-power switching elements as described above are shown in FIG. 7 and FIG. 8.
The gate drive circuit 3 shown in FIG. 7 is a circuit that uses a P-channel MOSFET 1 (hereinafter referred to as Q1) as an element for driving an IGBT 2 to ON. Q1 is turned on by setting the gate voltage thereof to a voltage lower than the source voltage. As a result, Q1 becomes conductive and a Vcc voltage appears at the drain terminal. This Vcc voltage is applied to the gate terminal of IGBT 2 through an output terminal 7 via a resistor 11.

Therefore, Q1 can be turned on by setting an IN terminal 5 in FIG. 7 to LOW. Then, when Q1 is turned on, IGBT 2 can be turned on as described above.
In this way, according to the gate drive circuit 3 having the circuit configuration shown in FIG. 7, IGBT 2 can be turned on (or turned off) by the input potential of the IN terminal 5.
However, in general, P-channel MOSFETs tend to have fewer types and larger ON resistance than N-channel MOSFETs, and using an N-channel MOSFET as Q1 in FIG. 7, as a circuit for turning on IGBT 2, can be expected to improve the performance.

Under such circumstances, the gate drive circuit having the circuit configuration shown in FIG. 8 has also been used. In this circuit configuration, the gate drive circuit 3a is configured by using an N-channel MOSFET as Q1a in FIG. 8. To turn the N-channel MOSFET on, the gate potential thereof has to be set to a voltage higher than the source potential. On the other hand, the source voltage of Q1a in FIG. 8 rises close to the plus-side voltage Vcc of the power supply of the gate drive circuit 3a. The plus-side voltage Vcc is supplied to a plus-side voltage terminal 4 in FIG. 8, and similarly in FIG. 7, the plus-side voltage Vcc is supplied to the plus-side voltage terminal 4.

Therefore, a bootstrap circuit and a level shift circuit as described below are configured to create a high potential for raising the gate potential of Q1a in FIG. 8 to a voltage higher than the source potential.
In the example of the circuit configuration shown in FIG. 8, a series circuit of a diode 12 (hereinafter referred to as D1) and a capacitor 13 (hereinafter referred to as C1) is connected between the OUT terminal 7 and the plus-side voltage terminal 4 as shown in FIG. 8. Then, when the OUT terminal 7 is at the GND potential, charge is stored in C1, and when the IN terminal 5 is set to High and Q1a is turned on, the output side transistor of a level shift photocoupler 10 (hereinafter referred to as PC1) is turned on to apply the charge charged to C1 to the gate terminal of Q1a. Thus, when Q1a is turned on and the voltage of the OUT terminal 7 rises, the terminal voltage at the point where C1 and the cathode side of D1 are connected becomes higher than Vcc, and a voltage higher than Vcc can be applied to the gate terminal of Q1a.

According to such a system, a power supply at a high potential for driving Q1a can be relatively easily produced by D1 and C1. However, it is considered that, to turn on Q1a by using the high-voltage power supply, some ingenuity in the circuit is required, for example, using an insulating element such as a photocoupler (PC1 in FIG. 8) to insulate the high-voltage power supply from the input potential of the IN terminal 5, or using a level shift circuit or the like to separately provide a switch that shifts the voltage level from the high-voltage power supply. Without such ingenuity, it is considered difficult to create a circuit that turns Q1a on/off by using the input potential of the IN terminal 5.
Prior Patented Technology For example, Patent Literature 1 (Japanese Patent No. 6303060), which will be described later, discloses a gate drive circuit using a P-channel MOSFET and an N-channel MOSFET. In particular, a circuit configuration is disclosed, in which an input signal is supplied to the P-channel MOSFET via a level shift circuit.

Patent Literature 2 (Japanese Laid-Open No. 2006-270382), which will be described later, discloses a circuit configuration, characterized by using a level shift circuit capable of high-speed operation, in a configuration that supplies power from a floating power supply to a high-side driver.

Patent Literature 3 (Japanese Laid-Open No. 2000-286687), which will be described later, discloses a circuit configuration, characterized by using a level shift circuit capable of preventing a malfunction without increasing the chip area and power consumption, in a configuration that supplies power from a floating power supply to a high-side driver.

CITATION LIST

Patent Literatures

[Patent Literature 1] Japanese Patent No. 6303060
[Patent Literature 2] Japanese Laid-Open No. 2006-270382
[Patent Literature 3] Japanese Laid-Open No. 2000-286687

SUMMARY OF INVENTION

Technical Problem

As described above, because the performance may be considered insufficient when a P-channel MOSFET is used as the main switch in the gate drive circuit, an N-channel MOSFET is often used, and a power supply with high potential for driving the N-channel MOSFET can be produced relatively easily. However, in order to drive the N-channel MOSFET by using the high-voltage power supply, an insulating component or a voltage shift circuit for eliminating the voltage difference from the input signal is required. It is also conceivable that the circuit may become complicated and expensive, and adopting the N-channel MOSFET cannot achieve a sufficient improvement effect. In view of such problems, the present invention aims to provide a high-side driver for a gate drive circuit using an N-channel MOSFET with a simpler circuit configuration.

Solution to Problem (1) In order to solve the above problem, the present invention provides a high-side driver, which is a circuit that drives a power semiconductor switch. The high-side driver includes: a main switch N-channel MOSFET which connects a drain terminal to a plus-side Vdc of a power supply of the circuit and connects a source terminal to an OUT terminal that is a terminal outputting a signal for driving the power semiconductor switch; a charge storage circuit which stores charge by injecting a current from the plus-side Vdc of the power supply of the circuit; and a voltage detection-capable switch which operates by detecting a voltage difference between an output terminal of the charge storage circuit and the plus-side Vdc of the power supply of the circuit. When detecting that an output terminal voltage of the charge storage circuit is higher than a voltage of the plus-side Vdc of the power supply of the circuit by a specific voltage or more, the voltage detection-capable switch applies part or all of an output voltage of the charge storage circuit to a gate terminal of the main switch N-channel MOSFET to turn on the main switch N-channel MOSFET.

(2) Further, according to the present invention, the high-side driver according to the above (1) includes: a starting P-channel MOSFET which is connected in parallel to the main switch N-channel MOSFET, and connects a source terminal to the plus-side Vdc of the power supply and connects a drain terminal to the OUT terminal; and an ON signal input terminal which inputs a signal for turning on the power semiconductor switch and is connected to a gate terminal of the starting P-channel MOSFET. When the signal for turning on the power semiconductor switch is input to the ON signal input terminal, the starting P-channel MOSFET is turned on, a voltage of the OUT terminal rises as the starting P-channel MOSFET is turned on, and the voltage detection-capable switch detects that the output terminal voltage of the charge storage circuit is higher than the voltage of the plus-side Vdc of the power supply of the circuit by the specific voltage or more, and applies part or all of the output voltage of the charge storage circuit to the gate terminal of the main switch N-channel MOSFET to turn on the main switch N-channel MOSFET.

(3) Further, according to the present invention, in the high-side driver according to the above (1) or (2), the voltage detection-capable switch includes an internal switch which is turned on and applies part or all of the output voltage of the charge storage circuit to the gate terminal of the main switch N-channel MOSFET when the voltage detection-capable switch detects that the output terminal voltage of the charge storage circuit is higher than the voltage of the plus-side Vdc of the power supply of the circuit by the specific voltage or more.

(4) Further, according to the present invention, the high-side driver according to any one of the above (1) to (3) includes: an OFF signal input terminal which inputs a signal for turning off the power semiconductor switch; a voltage conversion circuit which is connected between the plus-side Vdc of the power supply of the circuit and the OFF signal input terminal, and performs voltage conversion by dividing a voltage between the plus-side Vdc of the power supply of the circuit and the OFF signal input terminal and/or subtracting a specific value; a backflow prevention circuit which is provided between the gate terminal of the main switch N-channel MOSFET and a gate charge extraction MOSFET, and allows a current to flow only in a direction from the gate terminal of the main switch N-channel MOSFET toward the gate charge extraction MOSFET; and the gate charge extraction MOSFET which connects a drain terminal to the backflow prevention circuit and connects a source terminal to the OFF signal input terminal, and connects a gate terminal to an output terminal that outputs a voltage converted by the voltage conversion circuit. The drain terminal of the gate charge extraction MOSFET is connected to the gate terminal of the main switch N-channel MOSFET via the backflow prevention circuit, and when the signal for turning off the power semiconductor switch is input to the OFF signal input terminal and a voltage of the OFF signal input terminal descends from the plus-side Vdc of the power supply of the circuit, an output voltage of the output terminal that outputs the voltage converted by the voltage conversion circuit rises, the gate charge extraction MOSFET is turned on, and the main switch N-channel MOSFET is turned off.

Effects of the Invention

According to the present invention, it is not required to use an insulating element or the like, and it is possible to provide a high-side driver having a simpler configuration than before. In addition, it is possible to configure a gate drive circuit by using the high-side driver.

DESCRIPTION OF EMBODIMENTS

Hereinafter, preferred embodiments of the present invention will be described with reference to the drawings.
First, three types of principles of the present invention will be described, and then a high-side driver of a gate drive circuit, which is a specific embodiment of the present invention, will be described.
1. Principle 1

Figure 1A:
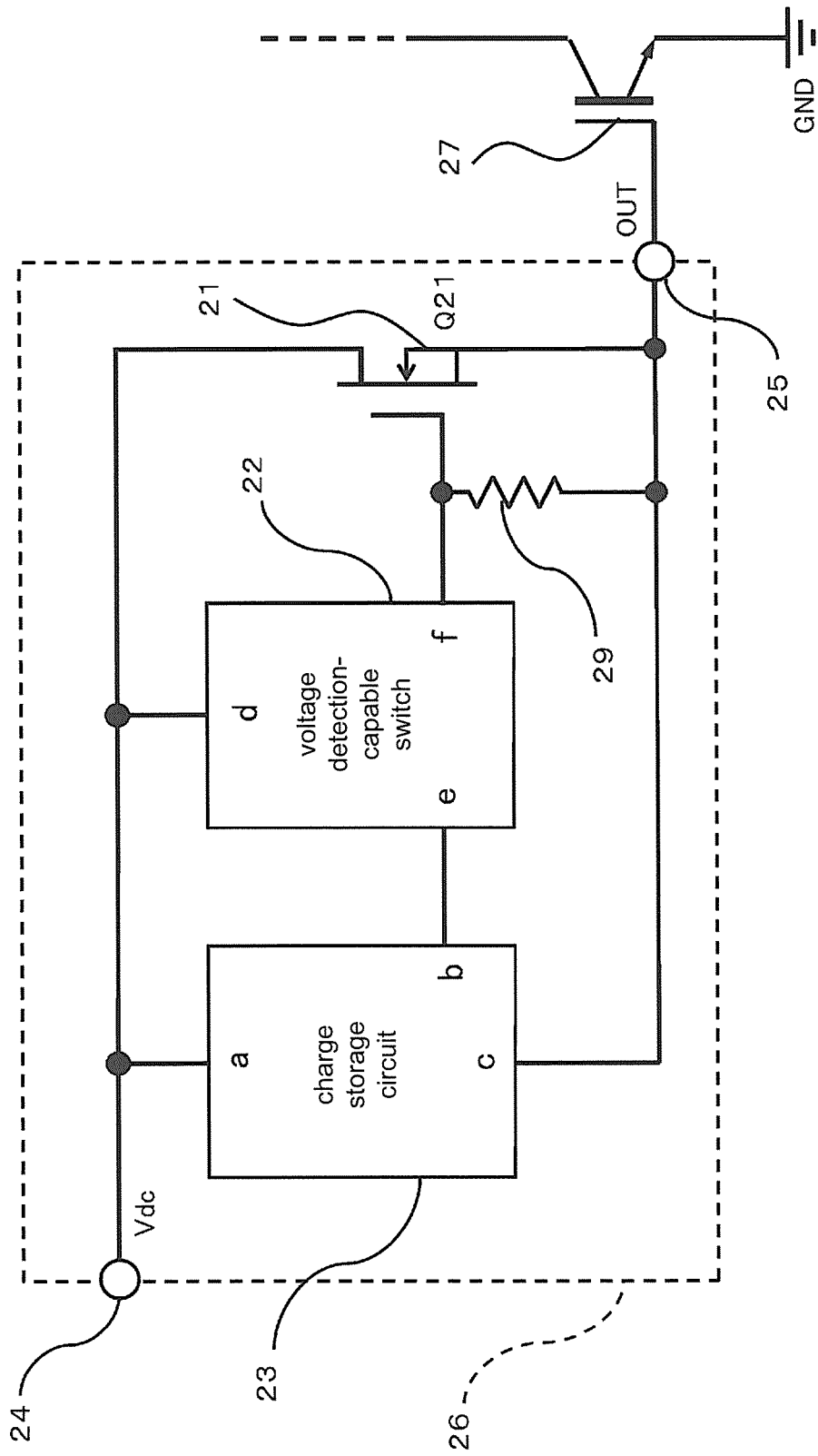
FIG. 1A is an explanatory diagram showing a circuit configuration of Principle 1 in the present embodiment.

FIG. 1A is a block diagram illustrating Principle 1 for solving the above problems in the present embodiment. In FIG. 1A, a gate drive circuit 26 according to Principle 1 is shown, and an IGBT 27 driven by the gate drive circuit 26 is also shown. Further, to facilitate understanding, a high-side driver, which is a characteristic configuration, is mainly shown, and the circuit configuration parts of the gate drive circuit, similar to the conventional ones, have the same functions as the conventional ones, so some parts may be omitted and not shown.

As shown in FIG. 1A, the gate drive circuit 26 in the explanatory diagram (FIG. 1A) of Principle 1 includes a charge storage circuit 23 and a voltage detection-capable switch 22 in addition to an N-channel MOSFET 21 (hereinafter referred to as Q21) which is the main switch. Q21 literally corresponds to a preferred example of the main switch N-channel MOSFET in the claims.

First, in FIG. 1A, an OUT terminal 25 is an output terminal, and the output voltage thereof swings between a voltage lower than GND and a plus-side voltage Vdc. The source terminal of Q21, which is the main switch of the gate drive circuit 26 in FIG. 1A, is connected to the OUT terminal 25, and the drain terminal thereof is connected to the plus-side voltage Vdc. When the gate voltage of Q21 becomes higher than the OUT terminal 25 (that is, source terminal) by Vgson (specific value), Q21 is turned on, and the output voltage (=about Vdc voltage) is output to the OUT terminal 25. However, here, Vgson means a gate threshold voltage of Q21.

Figure 5A:
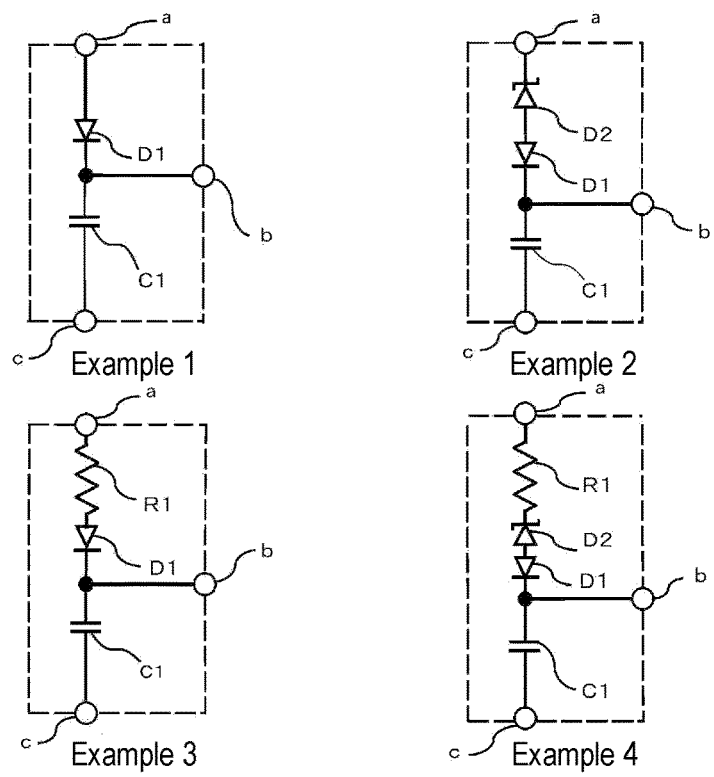
FIG. 5A is a diagram showing specific examples of a charge storage circuit.
Figure 5B:
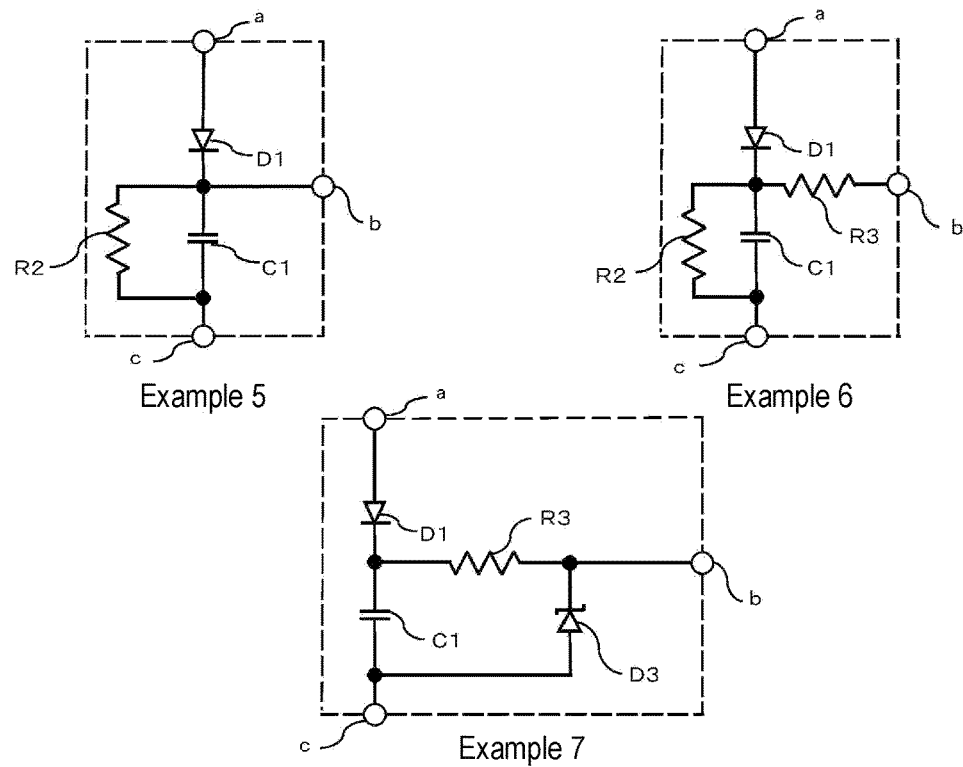
FIG. 5B is a diagram showing specific examples of a charge storage circuit.

The charge storage circuit 23 stores charge, but a pin for storing charge is different from a pin for discharging charge. First, when the OUT terminal 25 (the pin c connected thereto) has a low potential (=about GND or a voltage lower than GND), charge is stored by receiving the current supply from the pin a connected to the plus-side voltage Vdc. Then, the stored charge is superimposed on the potential of the OUT terminal 25 and is output from the pin b without flowing back to Vdc. Therefore, the potential of the pin b is higher than the potential of the OUT terminal 25 (source potential of Q1) by the voltage corresponding to the stored charge. The pin b is connected to the pin e of the voltage detection-capable switch 22 described below. Specific examples of the charge storage circuit 23 are shown in FIG. 5A and FIG. 5B, which will be described in detail later. These specific examples are typical examples, and other circuit configurations may be used.

Next, in the voltage detection-capable switch 22 in FIG. 1A, the pin d is connected to the plus-side voltage terminal 24 (Vdc), the pin e is connected to the pin b of the charge storage circuit 23, and the pin f is connected to the gate terminal of Q21. Under such a connection relationship, the voltage detection-capable switch 22 monitors the voltage between the pin d (in other words, plus-side voltage Vdc) and the pin e. As a result of this monitoring, when the voltage of the pin e becomes higher than the voltage of the pin d by a predetermined value or more, that is, when the voltage of the pin e becomes higher than Vdc by a predetermined voltage, the switch built therein is turned on and the voltage of the pin e is supplied to the pin f. Because the voltage corresponding to the charge stored in the charge storage circuit 23 is supplied from the pin b to the pin e, by turning on the switch built in the voltage detection-capable switch 22, part or all of the voltage corresponding to the stored charge can be applied between the gate and the source of Q21. As a result, a voltage higher than Vdc is applied to the gate (between the gate and the source) of Q21, and if the gate-source voltage of Q21 is Vgson or higher, Q21 is turned on.

When the OUT terminal 25 rises from the low potential toward Vdc, the charge storage circuit 23 superimposes the voltage between the pin b and the pin c due to the already stored charge on the voltage of the OUT terminal 25 and outputs the voltage from the pin b. This is because the pin c is connected to the OUT terminal 25. Since the voltage superimposed and output in this way is superimposed on the voltage of the OUT terminal 25, if the potential of the OUT terminal 25 rises, the voltage of the pin b also rises accordingly. When the voltage of the OUT terminal 25 further approaches Vdc, the voltage of the pin e of the voltage detection-capable switch 22 rises beyond the voltage of the pin d (that is, plus-side voltage Vdc). When the excess voltage difference reaches a predetermined value, the switch built in the voltage detection-capable switch 22 is turned on and applies part or all of the output voltage of the charge storage circuit 23 to the gate terminal of Q21. In other words, the built-in switch is functionally a switch that connects the pin e and the pin f, and as this built-in switch is turned on, all or part of the output voltage (pin b=pin e) of the charge storage circuit 23 is supplied to the pin f (=gate terminal of Q21). The built-in switch referred to here corresponds to a preferred example of the internal switch in the claims.

Here, the voltage output to the pin b (voltage between the pin b and the pin c) due to the charge stored by the charge storage circuit 23 is defined as $V_{CH}$, and the predetermined value (threshold voltage) of the voltage difference exceeding Vdc set in the voltage detection-capable switch 22 is defined as $V_{DET}$.

Then, the voltage $VO_{ON}$ of the OUT terminal 25 at which the switch built in the voltage detection-capable switch 22 is turned on is represented by the following equation (1). When Q21 is turned on, the output voltage of the OUT terminal 25 rises rapidly as Q21 is turned on, and finally reaches approximately Vdc.

$$VO_{ON} = V_{DET} - V_{CH} + Vdc \quad (1)$$

However, it is assumed that the following equation (2) is satisfied, where the voltage between the gate terminal and the source terminal at which Q21 is turned on is defined as Vgson and k is defined as a constant.

$$V_{CH} >= k \times Vgson \quad (2)$$

Here, k is a constant indicating the ratio of the output voltage of the charge storage circuit 23 applied to the gate terminal of Q21. k is a constant of 1 or less. When all of the output voltage of the charge storage circuit 23 is applied to the gate terminal of Q21, k=1. When ½ of the output voltage of the charge storage circuit 23 is applied to the gate terminal of Q21, k=½. In this way, part or all of the output voltage of the charge storage circuit 23 is applied to the gate terminal of Q21.

For example, assuming that the voltage $V_{CH}$ of the pin b due to the stored charge of the charge storage circuit 23 is set to $V_{CH}$=Vdc and the threshold voltage of the voltage detection-capable switch 22 is set to $V_{DET}$=Vdc/2, from the equation (1), the voltage $VO_{ON}$ of the OUT terminal 25 at which Q21 is turned on is $VO_{ON}$=Vdc/2. When the output voltage of the OUT terminal 25 reaches $VO_{ON}$=Vdc/2, the switch built in the voltage detection-capable switch 22 is turned on, and the voltage of $(1/k) \times V_{CH}$ is applied between the gate terminal and the source terminal of Q21. Therefore, if the above equation (2) is satisfied, Q21 is turned on.

As described above, the high-side driver having the configuration shown in FIG. 1A does not use an insulating element such as a voltage shift circuit or a photocoupler, and has a function of autonomously turning on and keeping the state of the ON operation when the voltage of the OUT terminal 25, which is its own output voltage, exceeds a certain value.

As shown in FIG. 1A, the pin f is connected to the gate terminal of Q21, and a resistor 29 may be provided between the gate terminal and the source terminal, but this is not an essential configuration.

1.2 Modified Example of Principle 1

Figure 1B:
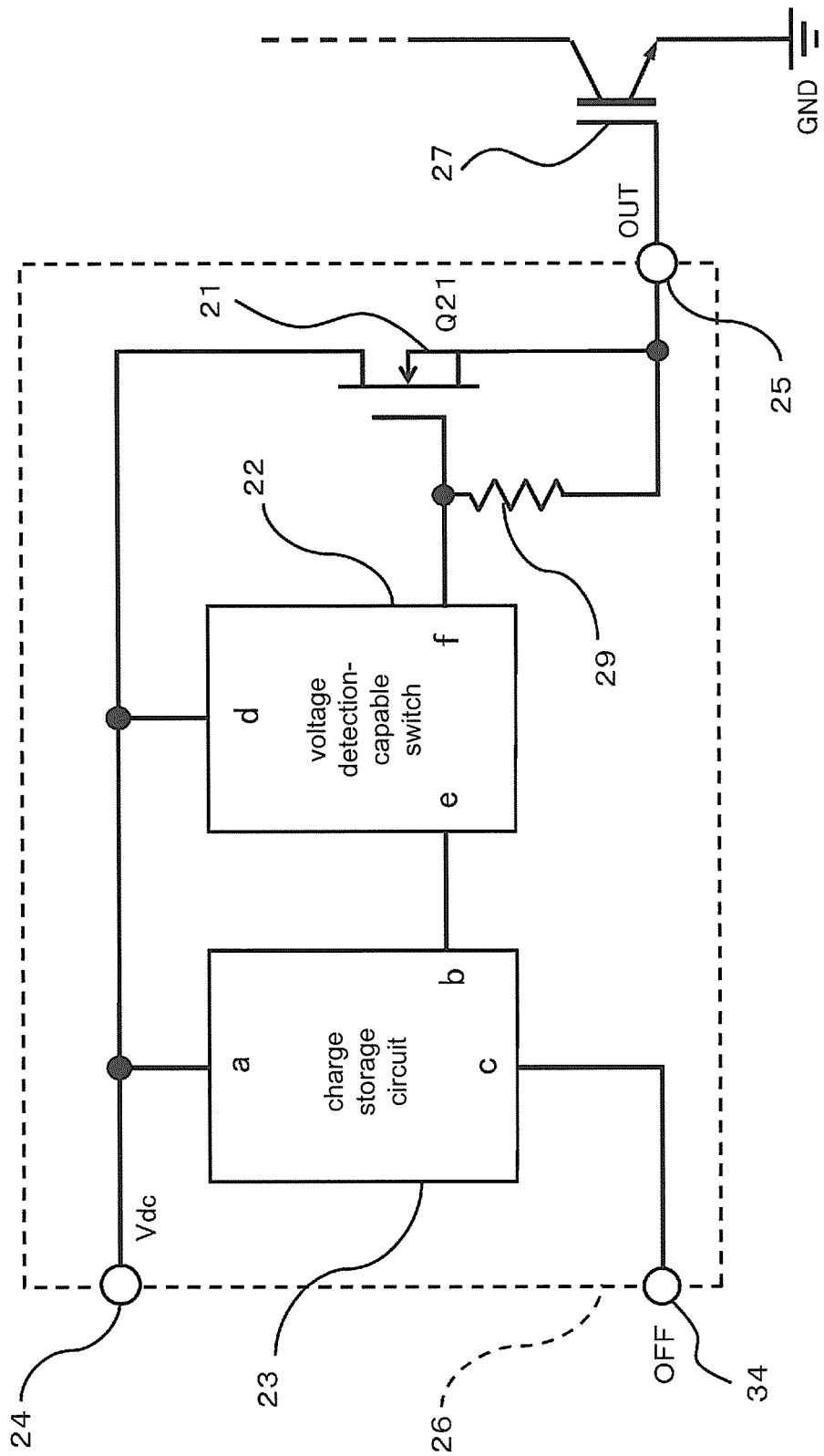
FIG. 1B is an explanatory diagram showing a circuit configuration of a modified example of Principle 1 in the present embodiment.

In the above-described Principle 1, the terminal c of the charge storage circuit 23 is connected to the OUT terminal 25. Therefore, the rise of the voltage at the OUT terminal 25 is applied to the terminal c. On the other hand, as shown in FIG. 1B, the terminal c of the charge storage circuit 23 may be connected to an OFF signal input terminal 34 instead of the OUT terminal 25. Here, the details of the OFF signal input terminal 34 and the signal input thereto will be described in FIG. 4 and the description of Principle 3 which will be described later.

Figure 2:
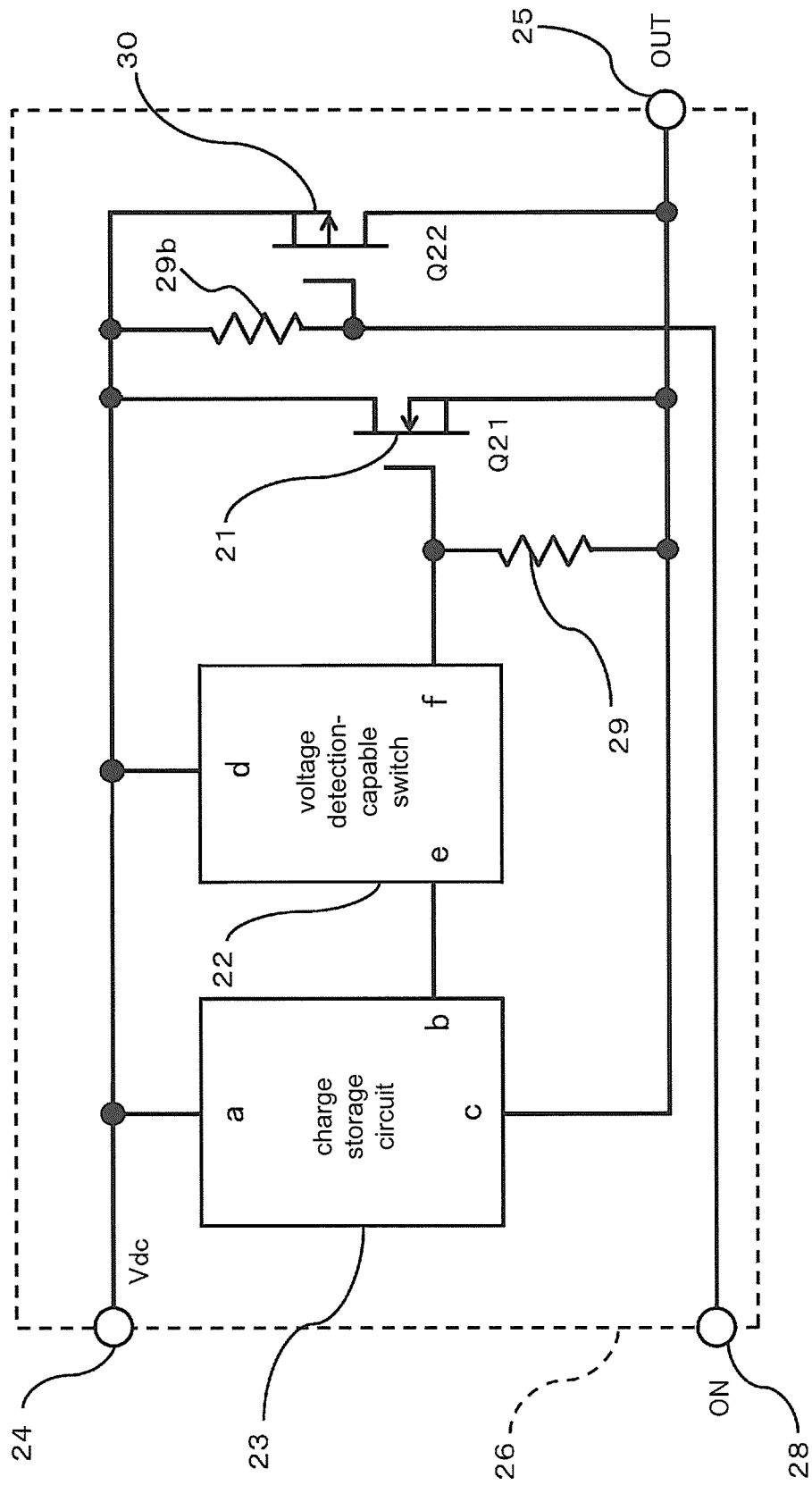
FIG. 2 is an explanatory diagram showing a circuit configuration of Principle 2 in the present embodiment.

In the case of the circuit according to Principle 1 described with reference to FIG. 1A, it is preferable to combine a starting P-channel MOSFET for starting as shown in FIG. 2 described later. With such a configuration, IGBT can be driven more reasonably. The details will be described in 2. Principle 2 later.

On the other hand, according to the modified example (FIG. 1B) of Principle 1 shown in FIG. 1B, unlike the circuit configuration shown in FIG. 1A, it is not required to combine a P-channel MOSFET, and a simpler circuit configuration can be achieved. However, this excludes cases where the IGBT to be driven has to be continuously turned on.

2. Principle 2

FIG. 2 is a diagram illustrating another Principle 2 of the present embodiment, in which the high-side driver of FIG. 1A described above is combined with a small-capacity semiconductor switch (starting P-channel MOSFET). Thereby, it is possible to provide a high-side driver of a gate drive circuit capable of driving IGBT more reasonably.

Operation of IGBT

Figure 3:
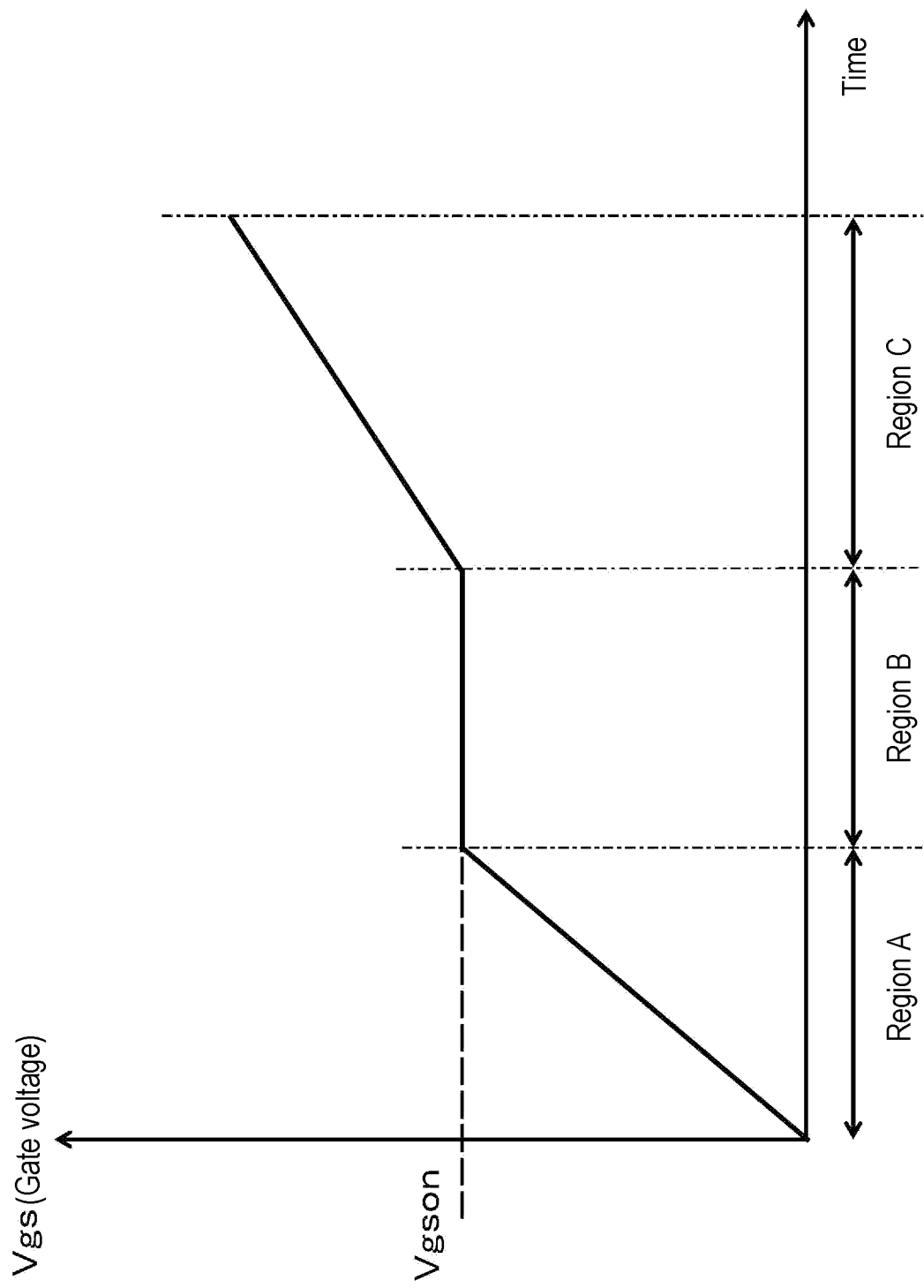
FIG. 3 is a graph showing a change in gate voltage when an IGBT or the like shifts to an ON operation.

The gate circuit of the semiconductor switch such as an IGBT goes through roughly three states in the process of shifting from the OFF operation to the ON operation. FIG. 3 shows a graph schematically showing the process. This graph is a graph showing how the gate voltage rises with time. First, in the region A, IGBT is in the state of the OFF operation, and it is a region in which only the gate voltage is rising.

The region B is a time zone in which IGBT shifts from the OFF operation to the ON operation. In this region, the rise of the gate voltage temporarily slows down. In this region B, the transition to the ON operation is progressing, and it is a time zone in which the collector potential of IGBT is descending. Since this region B is a time zone in which it is necessary to cover the discharge current of the charge of the feedback capacitance of IGBT, the region B is a time zone in which a large drive current is required. Since the output current of the gate drive circuit of IGBT is generally finite, a certain time is required for the charge of the feedback capacitance to be discharged. The time zone may be considered as this region B.

In the region C, the voltage between the collector terminal and the emitter terminal of IGBT is in a nearly saturated state (the collector potential is sufficiently lowered). This region C is a region in which only the gate voltage further rises to further ensure the state of the ON operation of IGBT.

Concept of FIG. 2 (Principle 2)

In order to switch IGBT from the OFF operation to the state of the ON operation at high speed, it is considered that a sufficiently large drive current is required in the region B as compared with the region A and the region C. The high-side driver of the gate drive circuit based on the principle shown in FIG. 2 was originally invented by the inventor of the present application as one of the circuits that reasonably satisfy the requirement in order to raise the gate voltage more quickly, considering such characteristics of IGBT.

The configuration of FIG. 2 is almost the same as the configuration of FIG. 1, and the difference lies in that a starting P-channel MOSFET 30 is newly added, and an ON signal is added to the starting P-channel MOSFET 30 (hereinafter referred to as Q22). Q22 corresponds to a preferred example of the starting P-channel MOSFET in the claims. The source terminal of Q22 is connected to Vdc (plus-side voltage terminal 24), and the drain terminal is connected to the OUT terminal 25. A resistor 29b is connected between Vdc and the gate terminal, and the ON signal is supplied to the gate terminal.

Hereinafter, the operation of the circuit configuration of FIG. 2 will be described. When the ON signal input terminal 28 shown in FIG. 2 is LOW, Q22 shifts from the state of the OFF operation to the ON operation. Then, the voltage of the OUT terminal 25 starts to rise toward Vdc. This time zone corresponds to the region A in FIG. 3. Although omitted in FIG. 2, it is assumed that the IGBT to be driven is connected to the OUT terminal in FIG. 2. The region target A here means the region A of the IGBT to be driven.

When the voltage of the OUT terminal (gate voltage of IGBT (not shown)) reaches the gate threshold voltage of the IGBT to be driven, the process enters the region B as described above. At this time, the voltage $V_{CH}$ of the pin b of the charge storage circuit 23 and the threshold voltage $V_{DET}$ of the voltage detection-capable switch are appropriately set based on the above equations (1) and (2) so that Q21 of the gate drive circuit is turned on.

Appropriate setting means that Q21 is set to turn on when IGBT enters the region B. Specifically, the gate voltage at which the IGBT to be driven enters the region B corresponds to $VO_{ON}$ in the equation (1), Vdc is determined by design, and $V_{CH}$ is determined from the equation (2) by using the coefficient k from Vgson of Q21. Therefore, $V_{DET}$ of the equation (1) can be obtained from these values. Each voltage value may be set by such a calculation.

In the high-side driver set in this way, Q21 is turned on when the IGBT to be driven enters the region B, so a large current can be supplied to the gate terminal of the IGBT to be driven, and the IGBT to be driven can be driven at high speed. When the charge storage circuit 23 of the high-side driver discharges the stored charge completely, the ON operation of Q21 cannot be maintained and Q21 enters the state of the OFF operation, but if the discharge time constant of the stored charge amount is set longer than the time during which the IGBT to be driven passes through the region B (see FIG. 3), the requirement for turning on IGBT can be satisfied. Once the IGBT to be driven enters the region C (see FIG. 3), it is not required to supply a large current to the gate terminal of the IGBT to be driven. Therefore, in the region C, the current supplied by Q22, which is a P-channel MOSFET, is sufficient. In other words, IGBT can be sufficiently driven.

As described above, the circuit configuration shown in FIG. 2 realizes reasonable high-speed switching of IGBT by using an N-channel MOSFET (that is, Q21) that can handle a large current for current supply in the region B, and using a P-channel MOSFET (that is, Q22) that is inferior to the N-channel MOSFET in terms of current value but can apply the power supply voltage Vdc with a simple circuit in the region A and the region C.
The characteristic of the capability of driving the N-channel MOSFET (Q21) as the main switch without using a photocoupler or a voltage shift circuit, which is the same as in FIG. 1, can also be efficiently used in FIG. 2. The present invention (Principle 2) can provide an inexpensive gate drive circuit that is suitable for high-speed driving of the IGBT to be driven with a simple circuit configuration.
3. Principle 3

Circuits characterized by the operation at the time of shifting the IGBT to be driven from the OFF operation to the state of the ON operation in Principle 1 (FIG. 1A) and Principle 2 (FIG. 2) have been mainly described so far. On the other hand, at the timing when the IGBT to be driven shifts from the ON operation to the OFF operation, it is usually necessary for another circuit to operate and start extracting the charge of the gate circuit of IGBT. At this time, the OFF operation of IGBT should not be hindered. The circuit configuration shown in Principle 3 (FIG. 4) is a circuit configuration having high noise resistance performance that satisfies these requirements. The circuit configuration shown in FIG. 4 is obtained by adding a voltage conversion circuit 31, a gate charge extraction MOSFET 32 (hereinafter referred to as Q32), and a backflow prevention circuit 33 to the circuit configuration shown in FIG. 1.

The pin g of the voltage conversion circuit 31 is connected to Vdc, the pin i is connected to the OFF signal input terminal 34, and the pin h is connected to the gate terminal of Q32. The source terminal of Q32 is connected to the OFF signal input terminal 34, and the drain terminal is connected to the backflow prevention circuit 33. The pin h is a so-called output terminal of the voltage conversion circuit 31, and corresponds to a preferred example of the output terminal in the claims.
One terminal of the backflow prevention circuit 33 is connected to the drain terminal of Q32, and the other terminal is connected to the terminal f of the voltage detection-capable switch 22, that is, the gate terminal of Q21. The backflow prevention circuit 33 may be, for example, a series circuit of a diode and a resistor, and the cathode side of the diode may be connected to the drain terminal of Q32 and the anode side may be connected to the pin f of the voltage detection-capable switch 22.

In order not to hinder the OFF operation of the IGBT to be driven, Q21 has to be rapidly set to the OFF operation state. When the IGBT to be driven shifts from the ON operation to the OFF operation, the collector current of IGBT decreases rapidly so noise due to the generated magnetic flux and spike noise due to the wiring inductance of the collector circuit are generated in the system. These noises may be superimposed on the control circuit or the drive circuit, causing the elements constituting the circuit to malfunction. Therefore, the circuit configuration for shifting Q21 from the ON operation to the OFF operation state is particularly required to prevent a malfunction due to noise and to have a high resistance to noise.

Figure 4:
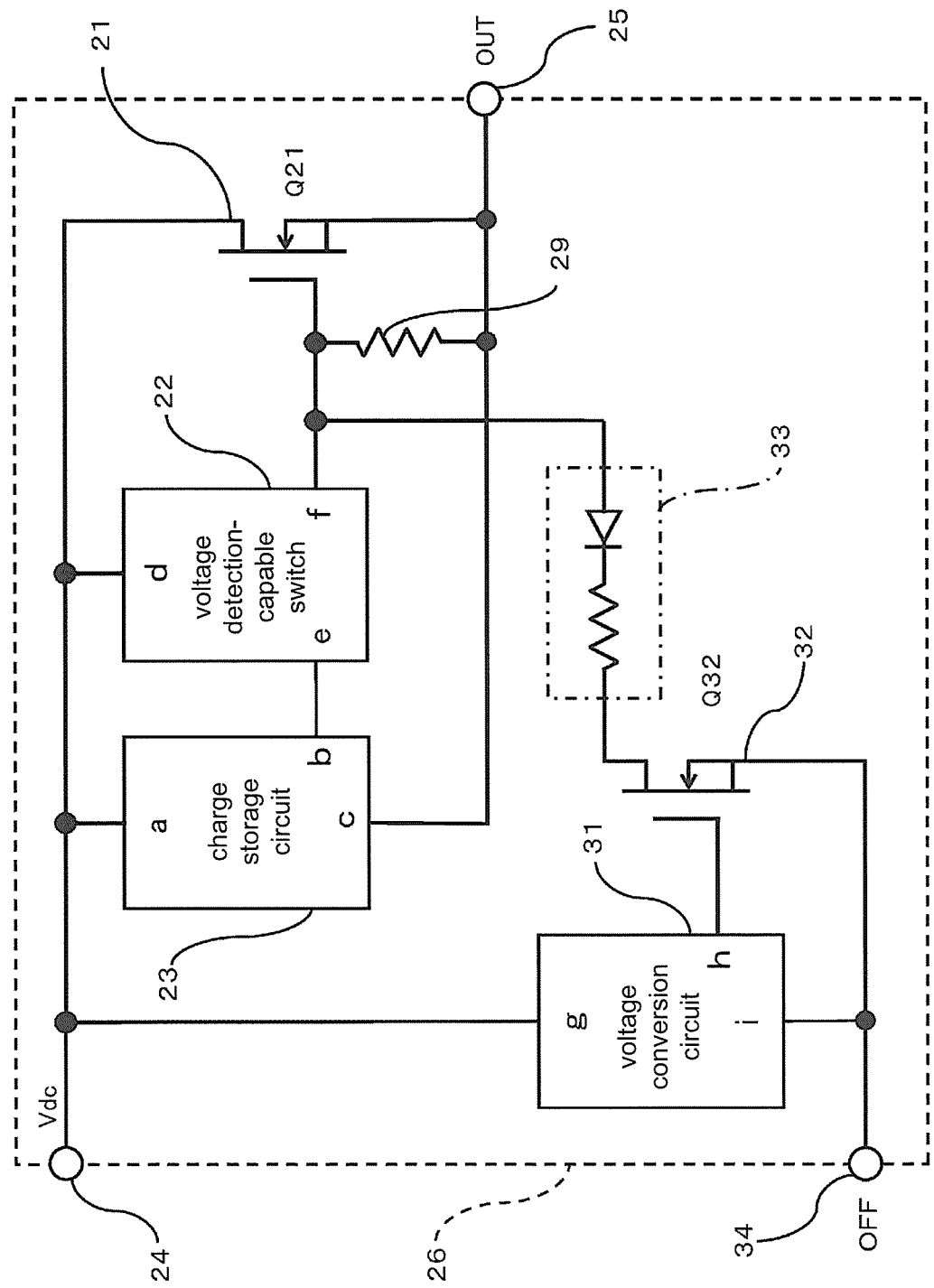
FIG. 4 is an explanatory diagram showing a circuit configuration of Principle 3 in the present embodiment.

FIG. 4 shows a circuit configuration having a high noise resistance when the N-channel MOSFET 21 (Q21), which is the main switch of the gate drive circuit, is turned off. The circuit configuration shown here is characterized in that the OFF signal input terminal 34 is connected to the source terminal of the gate charge extraction MOSFET 32 (Q32). In other words, the characteristic configuration that the OFF signal input terminal 34 is connected to the source terminal instead of the gate terminal of Q32 is adopted. The voltage conversion circuit 31 has a voltage conversion function of dividing the voltage between the pin g and the pin i and/or converting the voltage by a process such as subtracting a specific value. That is, the voltage conversion circuit converts the voltage between the pin g and the pin i by a predetermined mechanism, and outputs the converted voltage between the pin h and the pin i. However, the output voltage is a positive voltage. That is, the pin h is a preferred example of the output terminal in the claims.

In the example described later, the voltage conversion function will be described as an example of the process of subtracting a specific voltage, but the voltage conversion function may be dividing the voltage by using a resistor or the like (resistor voltage division). For example, the equations may be represented as follows.

pin $h$-pin $i$ voltage=pin $g$-pin $i$ voltage−specific voltage pin $h$-pin $i$ voltage=(pin $g$-pin $i$ voltage)×$t$ Here, the proportionality constant t may be a number in the range of 0<t=<1. Further, both of the above processes may be applied. That is, the voltage may be divided after a specific value is subtracted. Besides, the voltage may be divided and then a specific value is subtracted.

When the voltage of the OFF signal input terminal 34 is close to Vdc, since the voltage between the pin g and the pin i is approximately 0V, the voltage between the pin h and the pin i is also approximately 0V, and Q32 is turned off. When the voltage of the OFF signal input terminal 34 changes from Vdc in the descending direction, since a voltage (potential difference) is generated between the pin g and the pin i, a voltage obtained by converting the voltage is generated between the pin h and the pin i.

When the voltage of the OFF signal input terminal 34 further decreases, the voltage (difference) between the pin g and the pin i further increases. Along with this, the voltage between the pin h and the pin i also rises, and when the gate threshold voltage of Q32 is exceeded, Q32 is turned on. When Q32 is turned on, the gate charge of Q21 is discharged to the potential of the OFF signal input terminal 34 via the backflow prevention circuit 33. As a result, the gate potential of Q21 becomes a voltage value that is higher than the potential of the OFF signal input terminal 34 by the amount of the voltage drop generated in the backflow prevention circuit 33.
If the gate potential of Q21 is set lower than the gate threshold voltage (Vgson) of Q21, Q21 is turned off. Then, as a result of this operation, the boot strap circuit is in a state that does not interfere with the OFF operation of IGBT (the IGBT that is to be driven and connected to the OUT terminal 25) (not shown).

By turning off Q21, the OFF operation of the IGBT to be driven is not hindered, but in order to maintain this state, it is necessary to maintain the state of the OFF operation of Q21 even if the OUT terminal 25 becomes a Low voltage. Therefore, assuming that the Low voltage of the OUT terminal 25 is $VO_{low}$ and the amount of the voltage drop of the backflow prevention circuit 22 is $V_{dr}$, the input voltage $V_{INlow}$ of the OFF signal input terminal 34 for turning off Q21 has to satisfy the following equation (4). Further, because it is necessary to turn on Q32, the $V_{INlow}$ satisfying the equation (4) also needs to satisfy the equation (5) when the gate threshold voltage of Q32 is VgsonQ32 and further the conversion equation of the voltage conversion circuit 31 is represented by the equation (3). The input voltage itself of the OFF signal input terminal 34 is represented as $V_{IN}$. In addition, Vm represents a constant voltage used at the time of conversion in the voltage conversion circuit 31. Further, the gate threshold voltage of Q21 is represented by Vgson, which is the same as Principle 1.

Therefore, assuming the conditions of the following four items, satisfying the equation (4) and the equation (5) in the conditions is a condition for the high-side driver shown in FIG. 4 not to interfere with the OFF operation of the IGBT to be driven.

(Item 1.) The gate threshold voltage of Q32 is expressed as VgsonQ32.

(Item 2.) The conversion equation of the voltage conversion circuit 31 is expressed by the following equation (3), where the voltage between the pin h and the pin i is set to $V_{hi}$.

$$V_{hi}=Vdc-V_{IN}-Vm \quad (3)$$

(Item 3.) The voltage drop value of the backflow prevention circuit 33 is set to $V_{dr}$.

(Item 4.) The voltage of the OUT terminal 25 when Q21 is in the state of the OFF operation is set to $VO_{low}$. Then, the above-described equation (4) and equation (5) are as follows.

$$V_{INlow}>VO_{low}-V_{dr}+Vgson \quad (4)$$

$$V_{INlow}<Vdc-Vm-VgsonQ32 \quad (5)$$

Here, a state is taken as a premise, in which the input voltage of the OFF signal input terminal 34 is in the vicinity of Vdc (=15V), Q32 is turned off, Q21 is turned on, and as a result, the output voltage of the OUT terminal 25 is approximately in the vicinity of Vdc. Under this premise, it is considered a state that there is a command to turn off the IGBT to be driven and the OUT terminal 25 has to be set to −5V or less. That is, the condition is that $VO_{low}$=<−5V.
In order not to interfere with this command, if the voltage drop value $V_{dr}$ of the backflow prevention circuit 33=2V, Vgson=4V, then $V_{INlow}$<−3V from the above equation (4). Further, assuming that the gate threshold voltage of Q32 is VgsonQ32=4V and $V_{INlow}$=−3V, from the above equation (5), the constant Vm<14V of the conversion equation of the voltage conversion circuit 31 can be obtained.

As described above, in the high-side driver shown in FIG. 4, the OFF signal input terminal 34 is connected to the source terminal of the MOSFET 32 (Q32). Therefore, unless the voltage of the OFF signal input terminal 34 is changed from Vdc to $V_{INlow}$, the state of this circuit does not change to a state that does not interfere with the OFF operation of the IGBT to be driven.
That is, in the specific example of each voltage described above, the state does not change to a state that does not interfere with the OFF operation of IGBT unless the OFF signal input terminal 34 is changed from +15V to −3V. This means that the high-side driver in FIG. 4 requires a voltage change of 18V to change the state, and from the opposite point of view, the state is not changed for a voltage change (noise) of less than 18V. That is, it can be said that the noise resistance is very high.

In a circuit that has been put into practical use in the past, when trying to turn off Q21, the input signal is input to the gate terminal of the gate charge extraction MOSFET 32 (Q32), and the source terminal of Q32 is often connected to a fixed potential, for example, Vee (minus-side voltage). In such a case, the input signal is initially Vee, and in order to cause a state change (that is, in order to turn off Q21), a method generally used is to apply a voltage of about Vee+5V to the gate terminal of Q32 to turn on Q32 and turn off Q21.

However, in such a configuration, the voltage between the gate and the source of Q32 changes the state of the high-side driver by turning on Q32 with a change from 0V to 5V. In particular, the gate terminal of the MOSFET has a high input impedance and is easy to get noise. In that respect, this circuit (FIG. 4) shown in Principle 3 can take a voltage difference of 3 times or more, and is clearly superior to the conventional technique in terms of noise resistance characteristics.

4. Example of Charge Storage Circuit

Specific examples of the charge storage circuit 23 described so far are shown in FIG. 5A and FIG. 5B. As shown in FIG. 1, FIG. 2, and FIG. 4, the charge storage circuit 23 has the pin a, the pin b, and the pin c. In the circuit shown in Example 1 of FIG. 5A, a series circuit of the diode D1 and the capacitor C1 is provided between the pin a and the pin c, and the connection point between the diode D1 and the capacitor C1 is connected to the pin b. With such a circuit configuration, when the pin a is higher than the pin c due to the voltage drop of the diode D1, charge is stored in the capacitor C1, and as a result, a voltage is generated in the capacitor C1. This voltage appears on the pin b (between the pin b and the pin c). As already described, the voltage appearing on the pin b is connected to the pin e of the voltage detection-capable switch 22 and is supplied to the gate terminal of Q21 via the voltage detection-capable switch 22.

The circuit shown in Example 2 of FIG. 5A is a circuit in which the Zener diode D2 is connected in series with the diode D1 with respect to the circuit of Example 1. As a result, the capacitor C1 can be charged (stored with charge) with a lower voltage by the amount of the voltage drop of the Zener diode D2.

The circuit shown in Example 3 of FIG. 5A is a circuit in which the resistor R1 is connected in series with the diode D1 with respect to the circuit of Example 1. As a result, the charging current can be limited by the value of the resistor R1.

The circuit shown in Example 4 of FIG. 5A is a circuit in which the Zener diode D2 and the resistor R1 are connected in series with the diode D1 with respect to the circuit of Example 1. As a result, the capacitor C1 can be charged (stored with charge) with a lower voltage by the amount of the voltage drop of the Zener diode D2, and the charging current can be limited by the value of the resistor R1.

The circuit shown in Example 5 of FIG. 5B is a circuit in which the resistor R2 is connected in parallel to the capacitor C1 with respect to the circuit of Example 1. As a result, the charge stored in the capacitor C1 can be discharged, and the voltage output to the pin b can be lowered as time passes.
The circuit shown in Example 6 of FIG. 5B is a circuit in which the resistor R3 is provided between the connection point between the diode D1 and the capacitor C1 and the pin b with respect to the circuit of Example 5. As a result, the value of the current discharged from the pin b can be limited by the value of the resistor R3.

The circuit shown in Example 7 of FIG. 5B is a circuit in which the Zener diode D3 is connected between the pin c and the pin b and the resistor R1 is removed from the circuit of Example 6. As a result, the value of the current discharged from the pin b can be limited by the value of the resistor R3, and the voltage output from the pin b can be limited to the voltage of the voltage drop that occurs in the Zener diode D3.

5. Specific Embodiment of the Present Invention

Figure 6A:
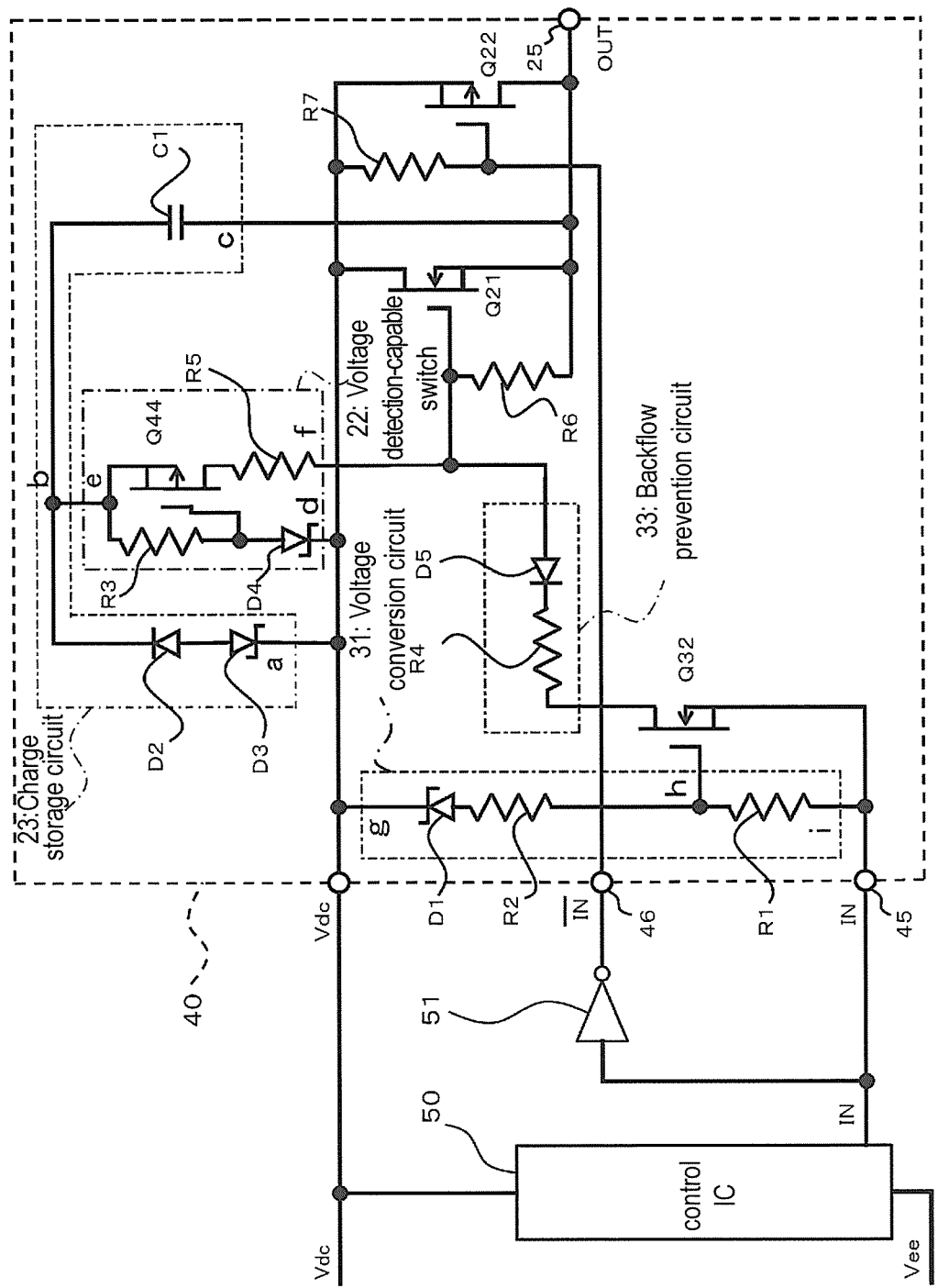
FIG. 6A is a circuit diagram showing an example of a specific circuit configuration of a gate drive circuit in the present embodiment.

FIG. 6A shows a circuit configuration of a gate drive circuit which is an example of the specific embodiment of the present invention. In particular, the range surrounded by the broken line is the gate drive circuit 40, which is a characteristic circuit in the present embodiment. Q21 is a P-channel MOSFET as the main switch. Q44 which is a P-channel MOSFET, a diode D4, a resistor R3, and a resistor R5 constitute the voltage detection-capable switch 22. Q44 corresponds to a preferred example of the internal switch in the claims.

The charge storage circuit 23 is composed of a diode D2, a diode D3, and a capacitor C1. The operations of these circuits are as described above. Q22 is a small-capacity semiconductor switch, which corresponds to Q22 in FIG. 2 and operates in the same manner as Q22 in FIG. 2. Q32 corresponds to Q32 in FIG. 4 and operates in the same manner as Q32 in FIG. 4. Further, the voltage conversion circuit 31 of FIG. 6A is composed of a diode D1, a resistor R2, and a resistor R1 and operates in the same manner as the voltage conversion circuit 31 of FIG. 4. The backflow prevention circuit 33 is composed of a diode D5 and a resistor R4 and operates in the same manner as the backflow prevention circuit 33 of FIG. 4.

The high-side driver of the gate drive circuit 40 shown in FIG. 6A is composed of a single module, and the signal inputs of this module are two types of signals, IN and inverted IN (represented by a symbol with a bar at the top of IN in FIG. 6A). The inverted IN is an inverted signal of the IN signal (see FIG. 6A).

It is assumed that the OUT terminal 25 and the IN terminal 45 swing from Vee to Vdc. Further, the inverted IN terminal 46 swings from Vdc to a voltage intermediate between Vdc and Vee.

A circuit outside the gate drive circuit 40 is also shown in FIG. 6A. A control IC 50 is a device that controls ON/OFF of the power semiconductor switch. Vdc and Vee are supplied to the control IC 50 as power supply. The control IC 50 operates by this power supply, generates the IN signal, and supplies the IN signal to the IN terminal 45 of the gate drive circuit 40 (see FIG. 6A). An inverter 51 inverts this IN signal, generates an inverted IN signal, and supplies the inverted IN signal to the inverted IN terminal 46 of the gate drive circuit 40.

When the potential of the OUT terminal 25 is approximately Vee, the IN terminal 45 is also at the potential of Vee, and Q32 is turned on and Q21 is turned off. In this state, the voltage of the IN terminal 45 satisfies the conditions of the above equation (4) and equation (5) and does not interfere with the OFF operation of the IGBT (not shown) to be driven. At this time, the capacitor C1 of the charge storage circuit 23 is charged by the current flowing from Vdc to Vee through the diode D3 and the diode D2. The charging voltage $V_{C1}$ of the capacitor C1 is represented by the following equation (6). $V_{C1}$ can be adjusted by the Zener voltage $V_{zd3}$ of the constant voltage diode D3. However, the forward voltage drop of the diode D2 is set to $VF_{D2}$.

$$V_{C1} = Vdc - Vee - V_{zd3} - VF_{D2} \qquad (6)$$

$V_{CH}$ of the equation (1) described above is equal to $V_{C1}$. This equation is the equation (7).

$$V_{C1} = V_{CH} \qquad (7)$$

This $V_{C1}(=V_{CH})$ is selected so as to satisfy the equation (2) because it is required to apply a gate voltage sufficiently exceeding the gate threshold voltage to Q21. When the IN terminal 45 becomes High (≈Vdc), Q32 is turned off, and the inverted IN terminal 46 becomes Low (≈intermediate potential between Vdc and Vee), Q22, which is a P-channel MOSFET that is a small-capacity semiconductor switch, is turned on. When Q22 is turned on, the voltage of the OUT terminal 25 starts to rise. However, this period is a period in which only the gate voltage of IGBT is rising while the IGBT to be driven is still in the state of the OFF operation (see the region A in FIG. 3 described above). When the voltage of the OUT terminal 25 continues to rise, the voltage of the pin b exceeds Vdc due to the charge stored by the charge storage circuit 23 and continues to rise further. Along with this, the voltage between the pin e and the pin d of the voltage detection-capable switch 22 rises.

When the voltage between the pin e and the pin d reaches the voltage $V_{DET}$ which is the threshold, that is, when the voltage of the OUT terminal 25 satisfies the equation (1), the voltage detection-capable switch 22 turns on Q44 which is its own switch. Along with the ON operation of Q44, a voltage obtained by multiplying the storage voltage $V_{C1}$ of the charge storage circuit 23 by the constant k is applied between the gate terminal and the source terminal of Q21 which is the main switch N-channel MOSFET, and Q21 rapidly shifts from the OFF operation to the state of the ON operation. When Q21 shifts to the ON operation, Q21 takes charge of a large current to cover the increase in the gate current due to the feedback capacity of IGBT while IGBT shifts from the OFF operation to the state of the ON operation (see the region B in FIG. 3). The charge amount and the discharge time constant of the capacitor C1 are selected so as to cover the time zone of the region B in FIG. 3. After the charge of the capacitor C1 is discharged and Q21 is turned off, Q22 secures the gate voltage of IGBT (see the region C in FIG. 3).

Next, in the state where IGBT is turned on, when a command to turn off IGBT comes from the system, the IN terminal 45 starts to shift to Low, and the inverted IN terminal 46 shifts to High. When the inverted IN terminal 46 becomes High, Q22 is turned off. The gate drive circuit 40 of the present embodiment starts shifting Q21 from the ON operation to the state of the OFF operation so as not to interfere with the OFF operation of IGBT. When the IN terminal 45 descends from Vdc toward Vee, a voltage is generated between the pin g and the pin i of the voltage conversion circuit 31. Along with this, the corresponding output voltage is output between the pin h and the pin i, which is the output of the voltage conversion circuit 31.

When the voltage drop of the IN terminal 45 progresses and the output voltage of the voltage conversion circuit 31 exceeds the gate threshold voltage of Q32, Q32 is turned on, and the gate charge of the main switch N-channel MOSFET (Q21) is extracted via the backflow prevention circuit 33. As a result, the gate potential of Q21 becomes a voltage obtained by adding the amount of the voltage drop of the backflow prevention circuit 33 to the potential of the IN terminal 45. The conversion equation of the voltage conversion circuit 31 is expressed by the following equation (8) if R1>>R2. $V_{hi}$ is the pin h-pin i voltage, which is the output of the voltage conversion circuit 31. Further, $V_m$ of the equation (3) corresponds to $Vz_{D1}$ of the following equation (8).

$$V_{hi}=Vdc-V_{IN}-Vz_{D1} \qquad (8)$$

The conditions for Q32 to be turned on are represented by the equation (5) already described. Assuming that the Low voltage of the OUT terminal 25 when IGBT is turned off is $VO_{low}$, the voltage of the IN terminal 45, which maintains the state of the OFF operation of Q21 even when the voltage of the OUT terminal 25 drops, is represented by the above equation (4).

Modified Example of FIG. 6A

Figure 6B:
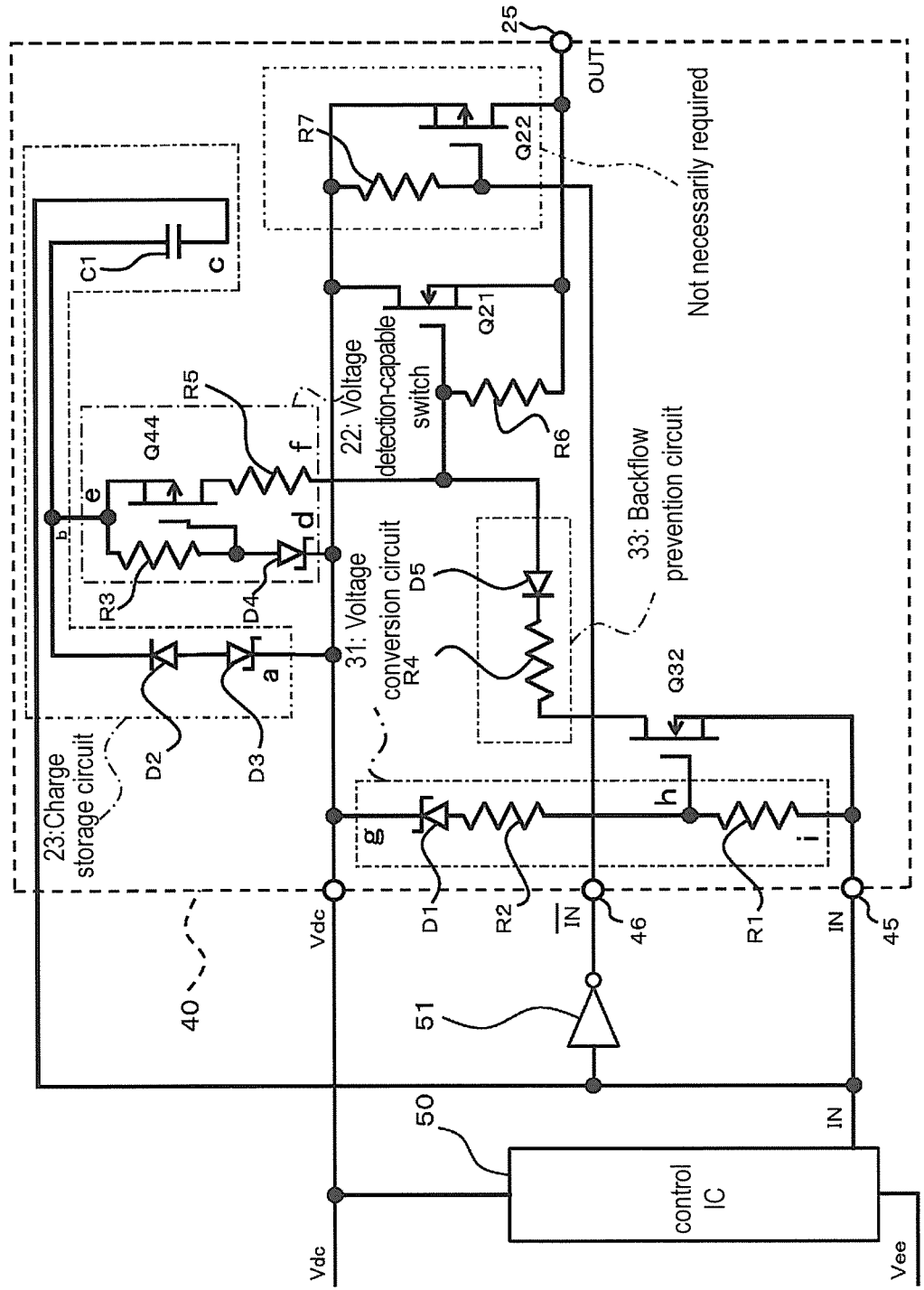
FIG. 6B is a circuit diagram showing an example of a specific circuit configuration of a gate drive circuit when a modified example of Principle 1 is used in the present embodiment.
Figure 7:
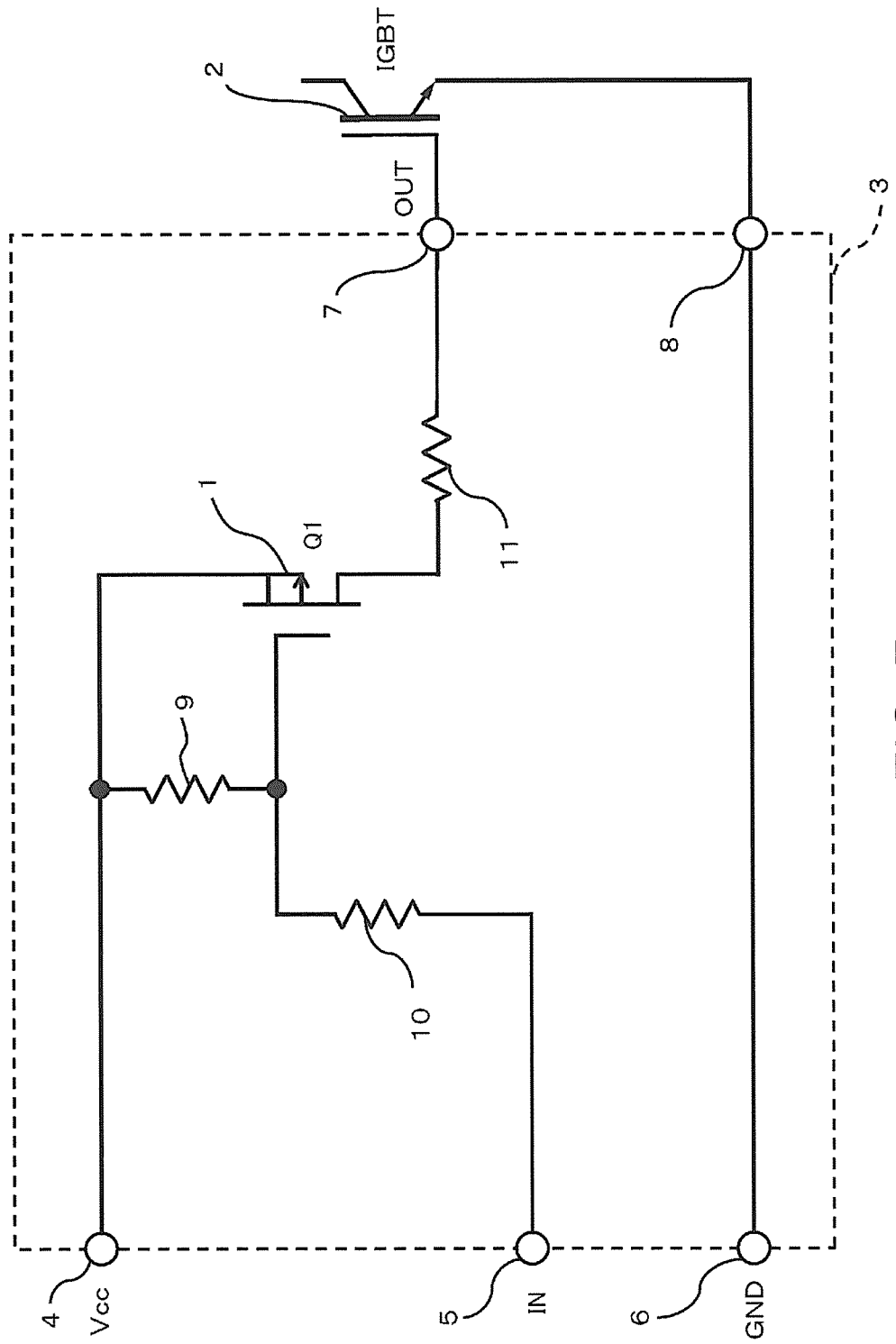
FIG. 7 is a circuit diagram of a conventional gate drive circuit using a P-channel MOSFET.
Figure 8:
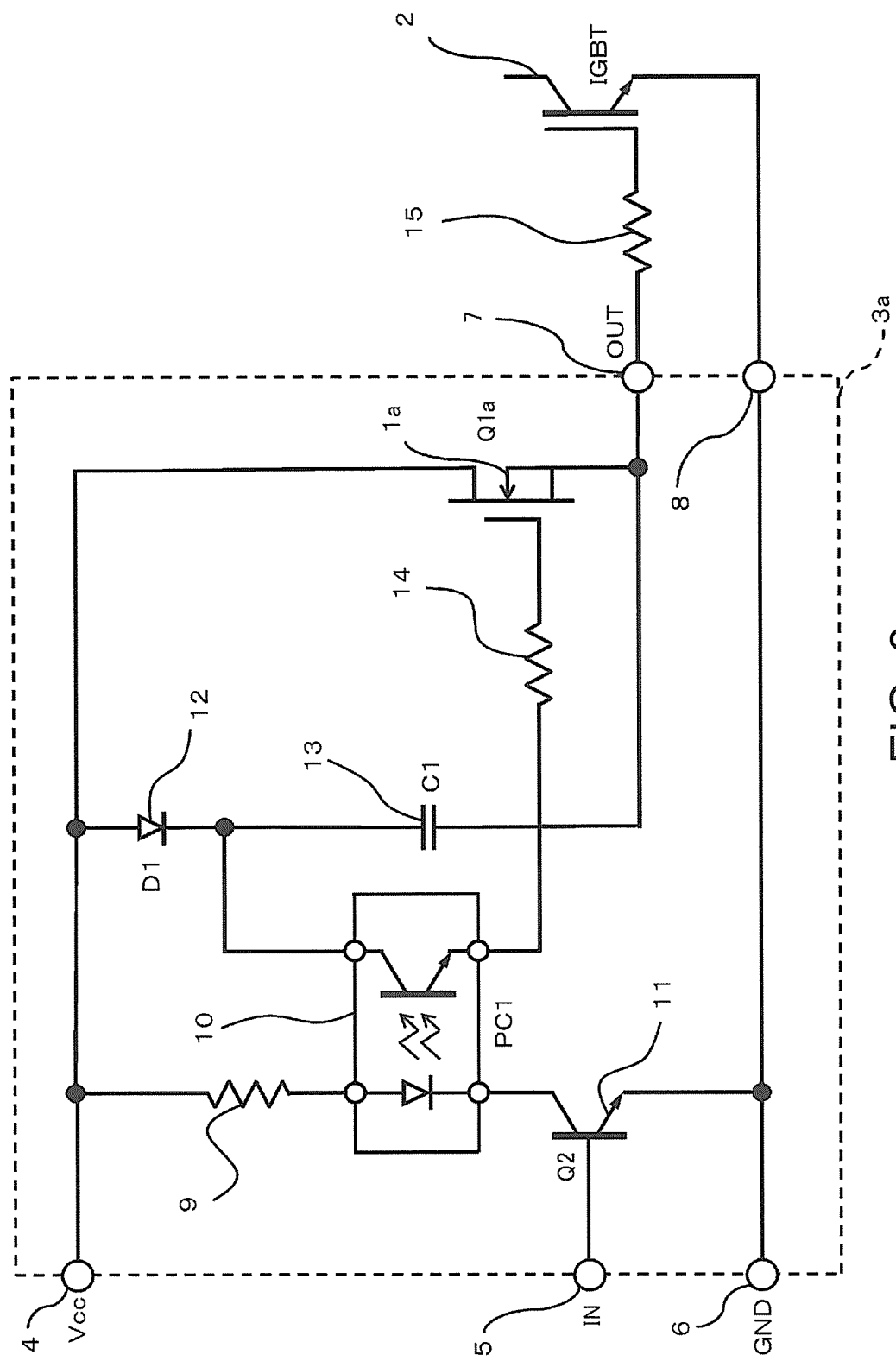
FIG. 8 is a circuit diagram of a conventional gate drive circuit using an N-channel MOSFET instead of a P-channel MOSFET.

The specific embodiment shown in FIG. 6A is an example using the configuration in which the terminal c of the charge storage circuit 23 is connected to the OUT terminal 25, that is, the circuit configuration shown in FIG. 1A (Principle 1). On the other hand, the circuit configuration shown in FIG. 1B (a modified example of Principle 1) may be used. As described above, a circuit diagram of the specific embodiment using the configuration of FIG. 1B is shown in FIG. 6B. That is, as shown in FIG. 6B, the terminal c of the charge storage circuit 23 is connected to the IN terminal 45 instead of the OUT terminal 25.

By adopting such a configuration, as described in "1.2 Modified example of Principle 1", it is not required to combine a P-channel MOSFET, and a simpler circuit configuration can be achieved. This means that, in FIG. 6B, the circuit including the resistor R7 and Q22 is not always necessary.

6. Effects and Others

As described above, the high-side driver and the gate drive circuit provided with the high-side driver in the present embodiment achieve the following effects.

The voltage generated by the charge storage circuit 23 is supplied to the main switch by using the voltage detection-capable switch 22. Therefore, the ON operation is autonomously performed by the voltage of the output voltage so it is not required to use a voltage shift circuit, an insulating element or the like, and the circuit configuration can be simplified.

In addition, since a more reasonable drive method is adopted in view of the operating characteristics of the power semiconductor switch to be driven, it is possible to provide an inexpensive gate drive circuit that is suitable for high-speed drive of the power semiconductor switch and has a simple circuit configuration.

Further, it is possible to provide a circuit that does not interfere with the OFF operation when the power semiconductor switch to be driven is turned off. Furthermore, it is possible to provide a circuit having excellent noise resistance as compared with the conventional circuit.

Moreover, the embodiment described above is an example of a means for realizing the present invention. The present invention should be appropriately modified or changed depending on the configuration and various conditions of the apparatus to which the present invention is applied, and the present invention is not limited to the aspects of the present embodiment. For example, in the above-described embodiment, IGBT is mainly described as the power semiconductor switch to be driven, but the present invention can also be applied to other power semiconductor switches.

Further, the configuration of the charge storage circuit and the voltage detection-capable switch circuit is an example, and other circuits having the same functions may be used.

Furthermore, in the present embodiment (the present invention), MOSFET is used as the main component, but other configurations may be used as long as they achieve the same effects. For example, various semiconductor switches and switches using other materials may also be used.

What is claimed is:

1. A high-side driver, for driving a power semiconductor switch, the high-side driver comprising:

a main switch N-channel MOSFET which has its drain terminal connected to a plus-side Vdc of a power supply of the high-side driver and has its source terminal connected to an OUT terminal that is a terminal outputting a signal for driving the power semiconductor switch;

a charge storage circuit which stores charge by injecting a current from the plus-side Vdc of the power supply of the high-side driver;

a voltage detection-capable switch which operates by detecting a voltage difference between an output terminal of the charge storage circuit and the plus-side Vdc of the power supply of the high-side driver, wherein when detecting that an output terminal voltage of the charge storage circuit is higher than a voltage of the plus-side Vdc of the power supply of the high-side driver by a specific voltage or more, the voltage detection-capable switch applies part or all of an output voltage of the charge storage circuit to a gate terminal of the main switch N-channel MOSFET to turn on the main switch N-channel MOSFET;

an OFF signal input terminal which receives a signal for turning off the power semiconductor switch;

a voltage conversion circuit which is connected between the plus-side Vdc of the power supply of the high-side driver and the OFF signal input terminal, and performs voltage conversion by dividing a voltage between the plus-side Vdc of the power supply of the high-side driver and the OFF signal input terminal and/or subtracting a specific value;

a backflow prevention circuit which is provided between the gate terminal of the main switch N-channel MOSFET and a gate charge extraction MOSFET, and allows a current to flow only in a direction from the gate terminal of the main switch N-channel MOSFET toward the gate charge extraction MOSFET; and the gate charge extraction MOSFET has its drain terminal connected to the backflow prevention circuit, its source terminal connected to the OFF signal input terminal, and its gate terminal connected to an output terminal that outputs a voltage converted by the voltage conversion circuit, wherein the drain terminal of the gate charge extraction MOSFET is connected to the gate terminal of the main switch N-channel MOSFET via the backflow prevention circuit, and when the signal for turning off the power semiconductor switch is input to the OFF signal input terminal and a voltage of the OFF signal input terminal descends from the plus-side Vdc of the power supply of the high-side driver, an output voltage of the output terminal that outputs the voltage converted by the voltage conversion circuit rises, the gate charge extraction MOSFET is turned on, and the main switch N-channel MOSFET is turned off.

2. The high-side driver according to claim 1, further comprising:

a starting P-channel MOSFET which is connected in parallel with the main switch N-channel MOSFET, and has its source terminal connected to the plus-side Vdc of the power supply and has its drain terminal connected to the OUT terminal; and an ON signal input terminal which receives a signal for turning on the power semiconductor switch and is connected to a gate terminal of the starting P-channel MOSFET, wherein when the signal for turning on the power semiconductor switch is applied to the ON signal input terminal, the starting P-channel MOSFET is turned on, a voltage of the OUT terminal rises as the starting P-channel MOSFET is turned on, and the voltage detection-capable switch detects that the output terminal voltage of the charge storage circuit is higher than the voltage of the plus-side Vdc of the power supply of the high-side driver by the specific voltage or more, and applies part or all of the output voltage of the charge storage circuit to the gate terminal of the main switch N-channel MOSFET to turn on the main switch N-channel MOSFET.

3. The high-side driver according to claim 1, wherein the voltage detection-capable switch comprises an internal switch which is turned on and applies part or all of the output voltage of the charge storage circuit to the gate terminal of the main switch N-channel MOSFET when the voltage detection-capable switch detects that the output terminal voltage of the charge storage circuit is higher than the voltage of the plus-side Vdc of the power supply of the high-side driver by the specific voltage or more.

4. The high-side driver according to claim 2, wherein the voltage detection-capable switch comprises an internal switch which is turned on and applies part or all of the output voltage of the charge storage circuit to the gate terminal of the main switch N-channel MOSFET when the voltage detection-capable switch detects that the output terminal voltage of the charge storage circuit is higher than the voltage of the plus-side Vdc of the power supply of the high-side driver by the specific voltage or more.

* * * * *